United States Patent
Hori et al.

(10) Patent No.: US 10,026,665 B2
(45) Date of Patent: Jul. 17, 2018

(54) SEMICONDUCTOR DEVICE

(71) Applicant: FUJI ELECTRIC CO., LTD., Kanagawa (JP)

(72) Inventors: Motohito Hori, Matsumoto (JP); Yoshinari Ikeda, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 77 days.

(21) Appl. No.: 15/219,296

(22) Filed: Jul. 26, 2016

(65) Prior Publication Data

US 2017/0077005 A1 Mar. 16, 2017

(30) Foreign Application Priority Data

Sep. 15, 2015 (JP) ................................. 2015-181572

(51) Int. Cl.
| | | |
|---|---|---|
| *H01L 23/48* | (2006.01) | |
| *H01L 23/049* | (2006.01) | |
| *H01L 23/16* | (2006.01) | |
| *H01L 23/373* | (2006.01) | |
| *H01L 23/053* | (2006.01) | |

(52) U.S. Cl.
CPC .......... *H01L 23/049* (2013.01); *H01L 23/053* (2013.01); *H01L 23/16* (2013.01); *H01L 23/3735* (2013.01)

(58) Field of Classification Search
CPC ................ H01L 23/049; H01L 23/315; H01L 23/16–23/26; H01L 23/02–23/10; H01L 23/40; H01L 23/4093
USPC ................................. 257/693, 695, 696, 697
See application file for complete search history.

(56) References Cited

U.S. PATENT DOCUMENTS

| | | | | |
|---|---|---|---|---|
| 5,646,445 A | * | 7/1997 | Masumoto | .............. H01L 23/24 257/703 |
| 5,739,585 A | * | 4/1998 | Akram | .................... H01L 23/13 257/680 |
| 6,861,737 B1 | * | 3/2005 | Jeong | ...................... H01L 23/13 257/666 |
| 8,143,717 B2 | * | 3/2012 | Medeiros, III | ........ H01L 23/055 257/710 |

(Continued)

FOREIGN PATENT DOCUMENTS

| | | |
|---|---|---|
| JP | H10-270608 A | 10/1998 |
| JP | 5319908 B2 | 10/2013 |

OTHER PUBLICATIONS

Nikkei Technology Online "Power semiconductor's largest showed, strategic products with enhanced flexibility" URL: techon.nikkeibp.co.jp/article/NEWS//20150422/415600/.

*Primary Examiner* — Kevin M Picardat (57) ABSTRACT

For a purpose of raising the breakdown voltage of a semiconductor device, the creepage distance and clearance between an electrode terminal and another metallic portion are preferably increased. A semiconductor device is provided, the semiconductor device including: a semiconductor element; a case portion that houses the semiconductor element; and an external terminal provided to a front surface of the case portion, wherein the front surface of the case portion has, formed thereon: a wall portion that protrudes from the front surface; and a hollow portion that is provided to a region surrounded by the wall portion and is depressed relative to the front surface, and the external terminal is arranged on a floor surface of the hollow portion.

13 Claims, 7 Drawing Sheets

(56) References Cited

U.S. PATENT DOCUMENTS

| | | | |
|---|---|---|---|
| 2004/0184239 A1* | 9/2004 | Zimmerman | H01L 21/50 361/712 |
| 2005/0280140 A1* | 12/2005 | Corbin, Jr. | H01L 23/367 257/706 |
| 2008/0212162 A1* | 9/2008 | Ichikawa | B81C 3/002 359/291 |

* cited by examiner

SEMICONDUCTOR DEVICE

BACKGROUND

The contents of the following Japanese patent application(s) are incorporated herein by reference:
No. 2015-181572 filed in JP on Sep. 15, 2015

1. Technical Field

The present invention relates to a semiconductor device.

2. Related Art

Conventionally, a semiconductor device housing, within a resin case, a power semiconductor element such as an IGBT has been known (see, for example, Patent Document 1).

Patent Document 1: Japanese Patent Application Publication No. H10-270608

In order to raise the breakdown voltage of a semiconductor device, the creepage distance and clearance between an external terminal and another metallic portion are preferably increased.

SUMMARY

Therefore, it is an object of an aspect of the innovations herein to provide a semiconductor device, which is capable of overcoming the above drawbacks accompanying the related art. The above and other objects can be achieved by combinations described in the claims.

A first aspect of the present invention provides a semiconductor device comprising: a semiconductor element; a case portion that houses the semiconductor element; and an external terminal provided to a front surface of the case portion. The front surface of the case portion has, formed thereon, a wall portion that protrudes from the front surface. Also, the front surface of the case portion has, formed thereon, a hollow portion that is provided to a region surrounded by the wall portion and is depressed relative to the front surface. Also, the external terminal is arranged on a floor surface of the hollow portion.

An external terminal may not be provided to the wall portion.

An upper end of the external terminal may be provided in the hollow portion.

At least a partial region of the external terminal may extend in a direction inclined relative to a normal line of the front surface of the case portion.

A depth of the hollow portion may be larger than a height of the wall portion.

The depth of the hollow portion may be at least twice as large as the height of the wall portion.

The case portion may have: a container portion that houses the semiconductor element and has an opening; and a lid portion that covers the opening of the container portion.

The front surface of the lid portion may have, formed thereon, the wall portion and the hollow portion.

A side surface of the case portion may have, formed thereon, an irregularity portion.

A depth of the hollow portion may be 5 mm or larger.

The hollow portion may have a first region and a second region that have different depths.

A floor surface of the hollow portion may have, formed thereon: a screw hole that fixes the external terminal to the floor surface; and a groove portion that surrounds the screw hole.

The semiconductor device may further comprise a sealing portion that is provided inside the hollow portion and seals in at least a part of the external terminal.

An opening of the hollow portion and the front surface of the case portion may have shapes that are similar to each other.

The front surface of the case portion may have a rectangular shape whose corner portions are chipped off, the opening of the hollow portion may have a rectangular shape, a plurality of the external terminals may be arranged on the floor surface of the hollow portion and to conform to a rectangular shape, Also, the external terminal may not be arranged at corner portions of the rectangular shape.

The summary clause does not necessarily describe all necessary features of the embodiments of the present invention. The present invention may also be a sub-combination of the features described above.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
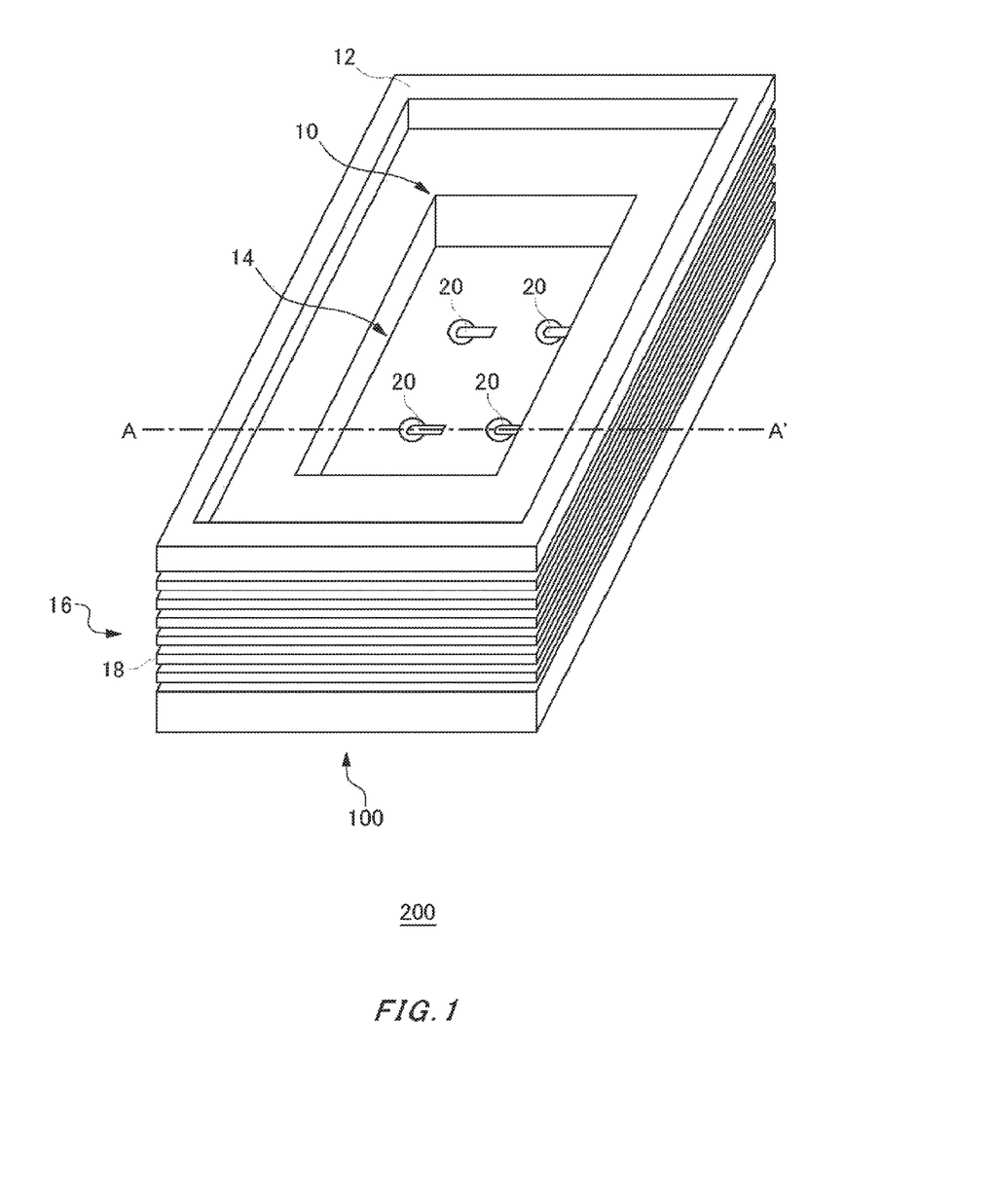
FIG. 1 is a perspective view of a semiconductor device 200 according to one embodiment.

FIG. 1 is a perspective view of a semiconductor device 200 according to one embodiment. The semiconductor device 200 comprises a case portion 100 and one or more external terminals 20. The case portion 100 houses a semiconductor element such as an IGBT. The case portion 100 is formed with an insulating material such as resin for example. The external terminals 20 are metal terminals that electrically connect an electrical part such as a semiconductor element housed in the case portion 100 and the outside of the case portion 100.

Note that the front surface 10 of the case portion 100 is not limited to a surface that is opposite to the ground. Also, terms referring to directions such as "up" or "down" in the present specification are not based on the direction of gravity, but indicate relative directions.

The case portion 100 according to the present example has an approximately rectangular parallelepiped shape. It should be noted that respective surfaces of the rectangular parallelepiped are not limited to planar surfaces, but each surface has, formed thereon, hollows and projections, chipped portions or the like as needed. In the case portion 100, a surface opposite to the front surface 10 is referred to as a rear surface, and a surface connecting the front surface 10 and the rear surface is referred to as a side surface 16. Also, the direction from the rear surface toward the front surface 10 is referred to as an upward direction, and the direction from the front surface 10 toward the rear surface is referred to as a downward direction.

The front surface 10 of the case portion 100 is provided with a wall portion 12 and a hollow portion 14. The wall portion 12 protrudes upward from the front surface 10. In the present example, the wall portion 12 has a portion protruding highest upward above the front surface of the case portion 100. The wall portion 12 is provided to surround a predetermined region of the front surface 10. The wall portion 12 according to the present example is provided along the edge of the front surface 10, and surrounds the entire front surface 10. It should be noted that the wall portion 12 may be provided apart from the edge of the front surface 10.

The hollow portion 14 is provided in a region surrounded by the wall portion 12. The hollow portion 14 is depressed relative to the front surface 10. The hollow portion 14 in the present example has a portion that is depressed lowest downward below the front surface of the case portion 100. At least a portion of the hollow portion 14 is provided apart from the wall portion 12. The entire hollow portion 14 may be provided apart from the wall portion 12.

One or more external terminals 20 are arranged on the floor surface of the hollow portion 14. Such a structure enables increase in the creepage distance and clearance between the external terminals 20 and another metallic member. For example, a metallic member such as a radiator plate is provided on the rear surface of the case portion 100 in some cases. The semiconductor device 200 according to the present example enables increase in the creepage distance and clearance between the metallic member and the external terminals 20 because the wall portion 12 and the hollow portion 14 are provided on the front surface 10 of the case portion 100.

Also, an irregularity portion 18 is provided on the side surface 16 of the case portion 100 according to the present example. The irregularity portion 18 has projections and depressions alternately in a direction linking the front surface 10 and rear surface of the case portion 100. Such a structure enables further increase in the creepage distance between the external terminals 20 and the metallic member on the rear surface of the case portion 100.

Note that in the semiconductor device 200, the wall portion 12 is preferably not provided with the external terminals 20. In the present example, all the external terminals 20 are provided to the floor surface of the hollow portion 14. Such a structure makes it possible to raise the breakdown voltage of the semiconductor device 200 because the creepage distance and clearance between all the external terminals 20 and a metallic member on the rear surface of the case portion 100 can be increased.

Figure 2:
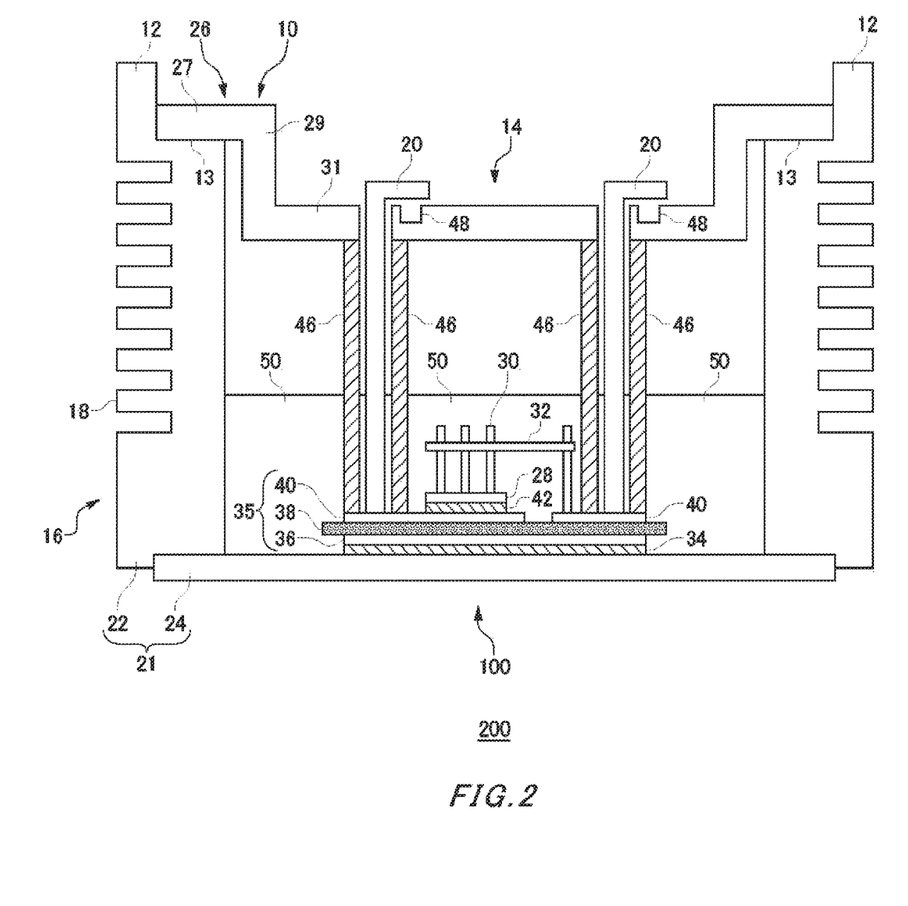
FIG. 2 shows a diagram showing one example of the cross-section taken through A-A' in FIG. 1.

FIG. 2 shows a diagram showing one example of the cross-section taken through A-A' in FIG. 1. The case portion 100 according to the present example has a container portion 21 and a lid portion 26. In the present example, the front surface of the lid portion 26 is provided with the wall portion 12 and the hollow portion 14. The container portion 21 houses an electrical part such as a semiconductor element 28. The container portion 21 according to the present example has a metallic plate 24 and a side wall portion 22.

The metallic plate 24 is provided as at least a portion of a floor portion of the case portion 100. A solder portion 34, a laminate substrate 35, a solder portion 42 and the semiconductor element 28 are placed sequentially on the metallic plate 24. The laminate substrate 35 is configured by a circuit layer 40, an insulating layer 38 and a metallic layer 36 that are laminated in this order. The laminate substrate 35 is for example a DCB (Direct Copper Bonding) substrate. The laminate substrate 35 is fixed to the front surface of the metallic plate 24 via the solder portion 34. The metallic plate 24 functions as a radiator plate.

The semiconductor element 28 is fixed to the circuit layer 40 of the laminate substrate 35 by the solder portion 42. The circuit layer 40 is configured with a predetermined circuit pattern, and connects the semiconductor element 28 and the external terminals 20. The external terminals 20 are provided to penetrate the lid portion 26 of the case portion 100. One end of each of the external terminals 20 is connected to the circuit layer 40, and the opposite end is exposed to the front surface of the lid portion 26. In the present example, insulating portions 46 are provided to surround the external terminals 20.

Also, a conductive pin 30 is connected to a front surface electrode of the semiconductor element 28 according to the present example. The pin 30 connects the semiconductor element 28 and a circuit board 32. Also, the circuit board 32 is connected to the circuit layer 40 through another pin 30. The circuit board 32 is for example a printed board.

The side wall portion 22 is provided to surround an electrical part arranged on the metallic plate 24. The side wall portion 22 is configured for example with insulating resin. The side wall portion 22 and the metallic plate 24 are fixed with an adhesive or the like. The side wall portion 22 according to the present example is provided along the edge of the metallic plate 24. That is, the side wall portion 22 is provided to be cylindrical, and one opening is covered by the metallic plate 24. Also, a part of the space surrounded by the side wall portion 22 is provided with a sealing portion 50. The sealing portion 50 is configured with an insulating material such as silicone gel for example.

The sealing portion 50 is arranged to seal in at least the semiconductor element 28. The opening of the cylindrical side wall portion 22 which is on the opposite side to the metallic plate 24 is covered by the lid portion 26. The side wall portion 22 extends in a direction almost vertical to the front surface of the metallic plate 24. The side surface 16 of the side wall portion 22 according to the present example is provided with the irregularity portion 18.

The front surface of the side wall portion 22 is provided with the wall portion 12 and a support portion 13. The support portion 13 contacts an end portion 27 of the lid portion 26 to support the lid portion 26. The support portion 13 of the side wall portion 22 and the lid portion 26 are fixed with an adhesive, a screw or the like.

The wall portion 12 protrudes above the support portion 13. Also, the wall portion 12 protrudes above the end portion 27 of the lid portion 26 supported by the support portion 13. The wall portion 12 according to the present example has a rectangular cross-section, but the cross-sectional shape of the wall portion 12 is not limited to a rectangular. A partial region of the wall portion 12 may be a curved surface. The support portion 13 is arranged, on the front surface 10, to be inside the wall portion 12.

The lid portion 26 is arranged to cover the opening of the container portion 21. The lid portion 26 according to the present example has the end portion 27, a floor portion 31 and a connection portion 29. The end portion 27, the floor portion 31 and the connection portion 29 are formed integrally with insulating resin.

The floor portion 31 according to the present example has a tabular shape that extends in a direction vertical to the side surface 16 of the container portion 21. The floor portion 31 according to the present example is arranged inside the cylindrical shape formed by the side wall portion 22. In this case, the floor portion 31 can be arranged below the support portion 13 of the side wall portion 22. Thereby, the floor surface of the hollow portion 14 is provided at a lower portion, and the creepage distance and clearance between the external terminals 20 and the metallic plate 24 can be increased easily.

The connection portion 29 connects an outer edge portion of the floor portion 31 and an inner edge portion of the end portion 27. A part of the connection portion 29 is provided below the support portion 13. The end portion 27 has a surface that extends in a direction vertical to the side surface of the container portion 21. The rear surface of the end portion 27 contacts the support portion 13. The front surface of the end portion 27 is provided below the upper end of the wall portion 12.

Also, the external terminals 20 are provided to penetrate the floor portion 31. Also, the external terminals 20 extend to positions at which they face screw holes 48 provided to the floor portion 31, and the external terminals 20 are fixed to the floor portion 31 by screws or the like. The upper ends of the external terminals 20 are preferably provided inside the hollow portion 14. That is, the upper ends of the external terminals 20 are preferably arranged below the front surface of the end portion 27. Thereby, the clearance between the external terminals 20 and the metallic plate 24 can be increased.

According to the present example, the wall portion 12 and the hollow portion 14 can be provided to the upper surface of the case portion 100. For this reason, the creepage distance and clearance which are between the metallic plate 24 and the external terminals 20 and are along the outer surface of the case portion 100 can be increased, and the breakdown voltage of the semiconductor device 200 can be raised.

Figure 3:
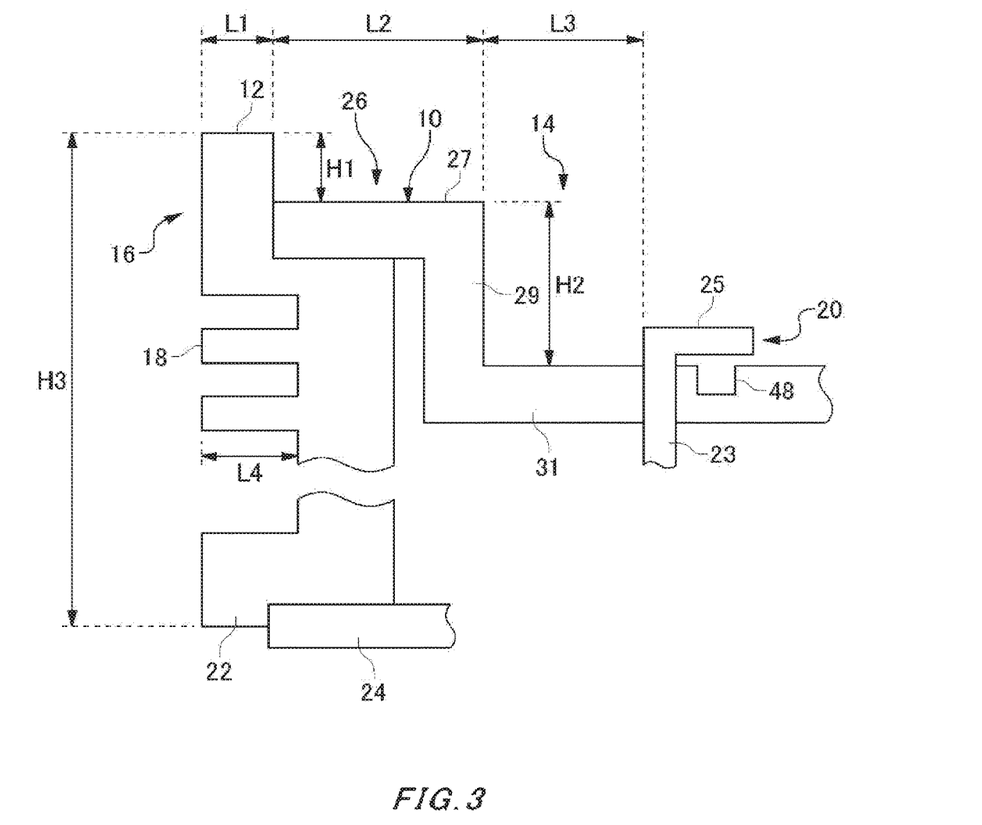
FIG. 3 is an enlarged view of the vicinity of a wall portion 12 and a hollow portion 14.

FIG. 3 is an enlarged view of the vicinity of the wall portion 12 and the hollow portion 14. In the present example, the height of the wall portion 12 is H1, the depth of the hollow portion 14 is H2, the height of the side wall portion 22 is H3, the width of the wall portion 12 is L1, the width of the end portion 27 is L2, the distance from the connection portion 29 to the external terminals 20 is L3, and the depth of the irregularity portion 18 is L4. These heights, depths, widths and distance are those as seen from the front surface of the end portion 27 of the lid portion 26 Also, the number of steps of depressions of the irregularity portion 18 is N.

The creepage distance between the metallic plate 24 and the external terminals 20 is approximately H1+H2+H3+L1+L2+L3+2N·L4. On the other hand, when the wall portion 12 and the hollow portion 14 are not provided, the creepage distance is approximately H3+L1+L2+L3+2N·L4.

Because the positions of the external terminals 20 are determined according to the specification of an electrical part to be housed, the width of the case portion 100 in the lateral direction has to be increased when L1+L2+L3 is to be increased. Also, the case portion 100 has to be taller when H3 and 2N·L4 are to be increased. For this reason, when the wall portion 12 and the hollow portion 14 are not provided, the case portion 100 itself becomes larger when the creepage distance is to be increased. This applies to the clearance similarly.

On the other hand, because H1 and H2 can be adjusted by providing the wall portion 12 and the hollow portion 14, the creepage distance and clearance can be increased without increasing the case portion 100 itself. In particular, it becomes easy to increase H2 when the hollow portion 14 is to be arranged in a cylindrical space surrounded by the side wall portion 22.

The depth H2 of the hollow portion 14 according to the present example is larger than the height H1 of the wall portion 12. Thereby, the creepage distance and clearance between the external terminals 20 and the metallic plate 24 can be increased further. As one example, the depth H2 of the hollow portion 14 is at least twice as large as the height H1 of the wall portion 12. The depth H2 of the hollow portion 14 may be at least four times as large as the height H1 of the wall portion 12.

Also, the depth H2 of the hollow portion 14 according to the present example is 5 mm or larger. The depth H2 of the hollow portion 14 may be 10 mm or larger, and 15 mm or larger.

Note that in the example shown in FIG. 1 to FIG. 3, the wall portion 12 includes an upper surface arranged highest above the front surface 10 of the case portion 100. Also, the hollow portion 14 includes a floor surface arranged lowest below the front surface 10 of the case portion 100. Also, among surfaces provided between the upper surface of the wall portion 12 and the floor surface of the hollow portion 14, a flat surface with the largest area is handled as a reference surface. The height H1 of the wall portion 12 refers to the height from the reference surface to the upper surface of the wall portion 12. The depth H2 of the hollow portion 14 refers to the depth from the reference surface to the floor surface of the hollow portion 14. As in the example shown in FIG. 2, in a structure in which the end portion 27 of the lid portion 26 is supported by the support portion 13 of the side wall portion 22, the height H1 and the depth H2 may be determined by handling the front surface of the end portion 27 as the reference surface.

Also, at least a partial region of the external terminal 20 extends in a direction inclined relative to the normal line of the front surface 10 of the case portion 100. The external terminal 20 according to the present example has a first region 23 and a second region 25. The first region 23 penetrates the floor portion 31 of the lid portion 26. The second region 25 extends from an end portion of the first region 23, and in a direction parallel with the front surface 10 of the case portion 100. The second region 25 extends at least to a position at which it faces the screw hole 48. The second region 25 is fixed to the floor portion 31 by a screw or the like.

In this manner, due to the external terminals 20 being bent in the hollow portion 14, increase in the heights of portions of the external terminals 20 protruding from the floor surface of the hollow portion 14 can be suppressed. For this reason, the clearance between the external terminals 20 and the metallic plate 24 can be increased.

(Variant 1)

Figure 4:
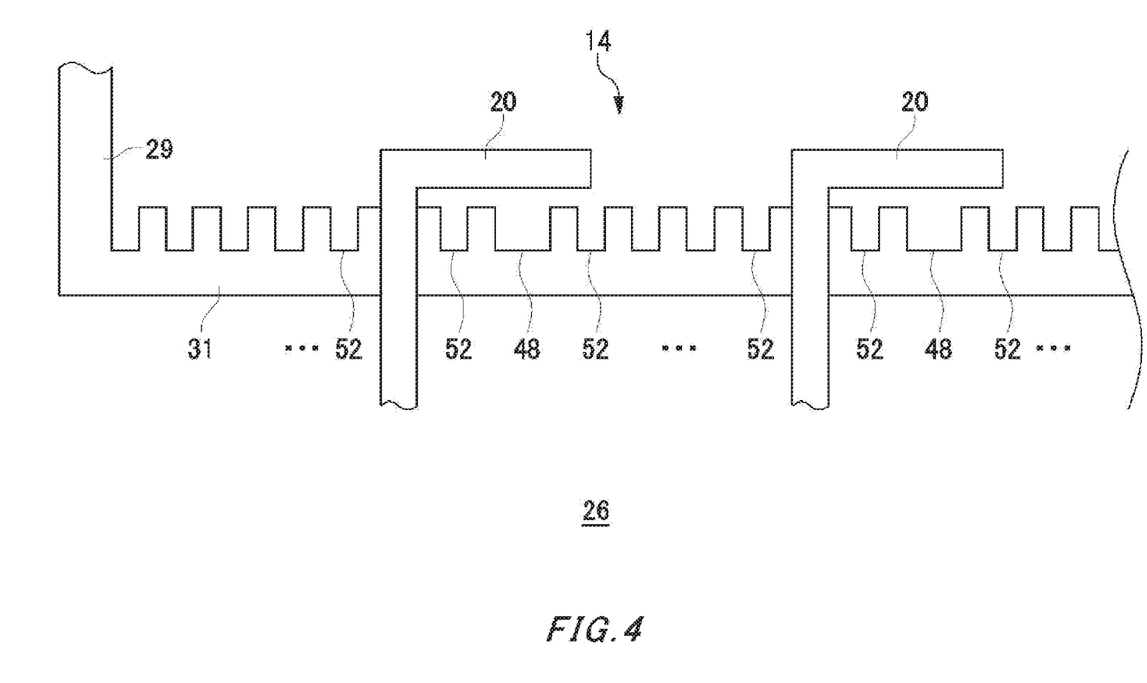
FIG. 4 is a diagram showing a variant of the shape of a floor portion 31 of a lid portion 26.

FIG. 4 is a diagram showing a variant of the shape of the floor portion 31 of the lid portion 26. The floor portion 31 according to the present example has the one or more screw holes 48, and one or more groove portions 52. By providing the groove portions 52 to the floor portion 31, the creepage distance between the external terminals 20 and the metallic plate 24 can be increased further. The screw holes 48 are provided to each of the external terminals 20, and fix the external terminals 20 to the floor portion 31.

At least one groove portion 52 is provided on the front surface of the floor portion 31 (that is, on the floor surface of the hollow portion 14) so as to surround the screw hole 48. Thereby, the creepage distance between a metallic screw inserted to the screw hole 48 and another metallic member can be increased.

Also, the floor portion 31 in the present example is provided with the groove portions 52 between the external terminals 20 and the connection portion 29. Also, the groove portions 52 are provided between the two external terminals 20 as well.

Thereby, the creepage distance between the external terminals 20 and the other metallic member can be increased.

(Variant 2)

Figure 5:
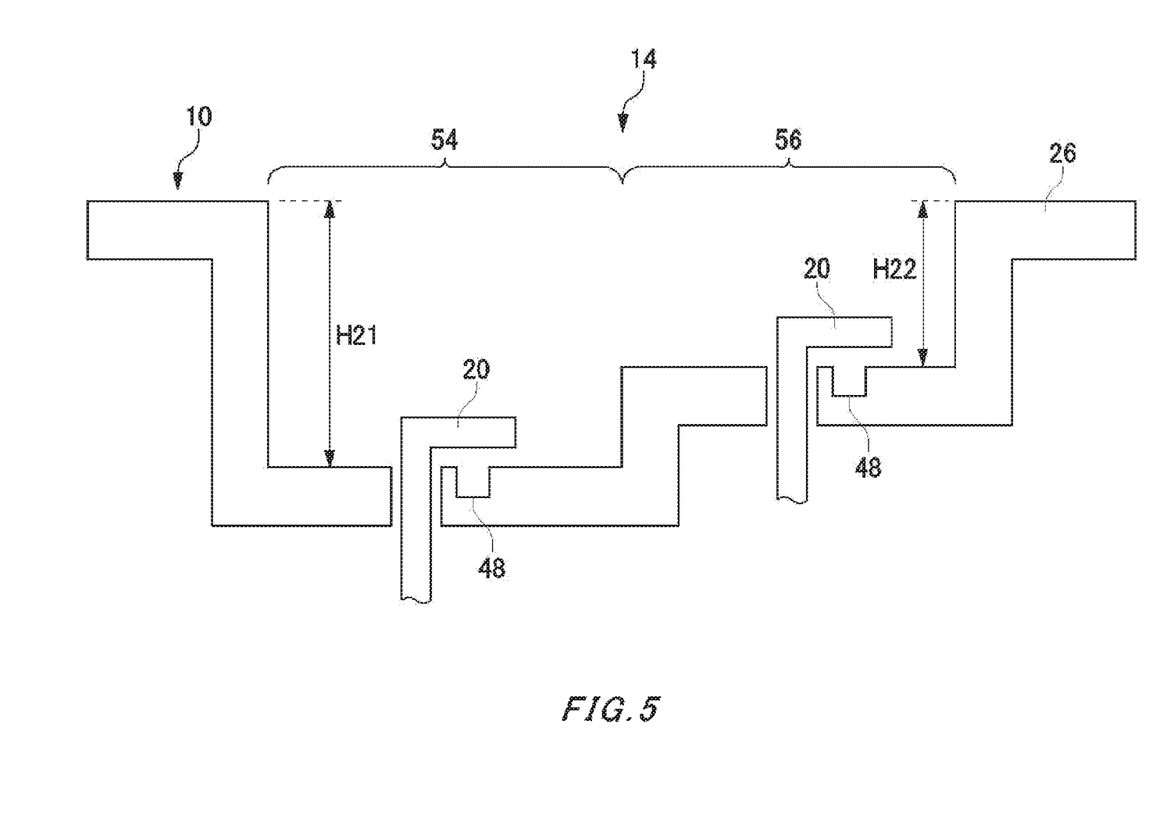
FIG. 5 is a diagram showing a variant of the shape of the hollow portion 14.

FIG. 5 is a diagram showing a variant of the shape of the hollow portion 14. The hollow portion 14 according to the present example has a first region 54 and a second region 56 that have different depths. Specifically, a depth H21 of the first region 54 is larger than a depth H22 of the second region 56. The floor surfaces of the hollow portion 14 in the respective regions are provided with the external terminals 20.

There might be cases where due to the shape of the inner space of the case portion 100 or the arrangement of a semiconductor element, the deep hollow portion 14 can be formed in a partial region and the deep hollow portion 14 cannot be formed in the other region. In such cases also, because the hollow portion 14 has a plurality of regions having different depths, the depths of the hollow portion 14 can be maximized region by region.

Note that an external terminal 20 to which relatively high voltage is applied is exposed preferably in the deep first region 54. An external terminal 20 to which low voltage or ground potential is applied is exposed preferably in the shallow second region 56. Thereby, the creepage distance related to the external terminal 20 to which high voltage is applied can be increased further.

Note that Variant 2 can be combined with Variant 1. In this case, the floor surface of at least either one of the first region 54 and the second region 56 is provided with the one or more groove portions 52. Thereby, the creepage distance can be increased.

(Variant 3)

Figure 6:
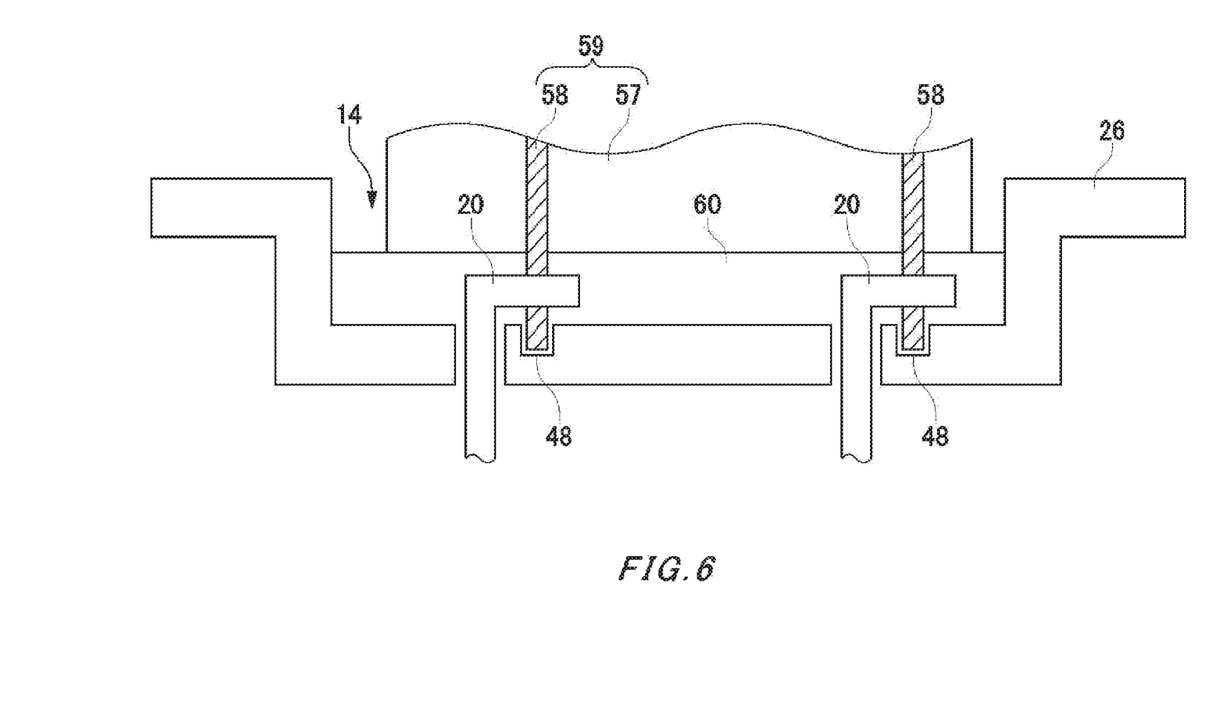
FIG. 6 is a diagram showing a variant of the structure of the hollow portion 14.

FIG. 6 is a diagram showing a variant of the structure of the hollow portion 14. The hollow portion 14 according to the present example is provided therein with a sealing portion 60 that seals in at least parts of the external terminals 20. Also, connection terminals 58 that are inserted to the screw holes 48 and electrically connect with the external terminals 20 are inserted inside the hollow portion 14. As one example, the connection terminals 58 are terminals of an external apparatus that electrically connect with the semiconductor device 200. Also, the connection terminals 58 are sealed in by an insulating resin 57 at portions of them other than portions at which they are connected with the external terminals 20, and the connection terminals 58 and the insulating resin 57 are formed integrally as a connection unit 59.

The sealing portion 60 is configured with an insulating material such as silicone gel for example. The sealing portion 60 according to the present example is arranged to cover the entire external terminals 20 and exposed portions of the connection terminals 58. Because the external terminals 20 are provided inside the hollow portion 14, the sealing portion 60 to seal in the external terminals 20 can be provided easily. Also, because the external terminals 20 and the connection terminals 58 are sealed in with the sealing portion 60 and the insulating resin 57 at the hollow portion 14, short circuits can be surely prevented. Such a structure enables improvement in breakdown voltage around the external terminals 20. Note that Variant 3 can be combined with any or both of Variant 1 and Variant 2.

(Variant 4)

Figure 7:
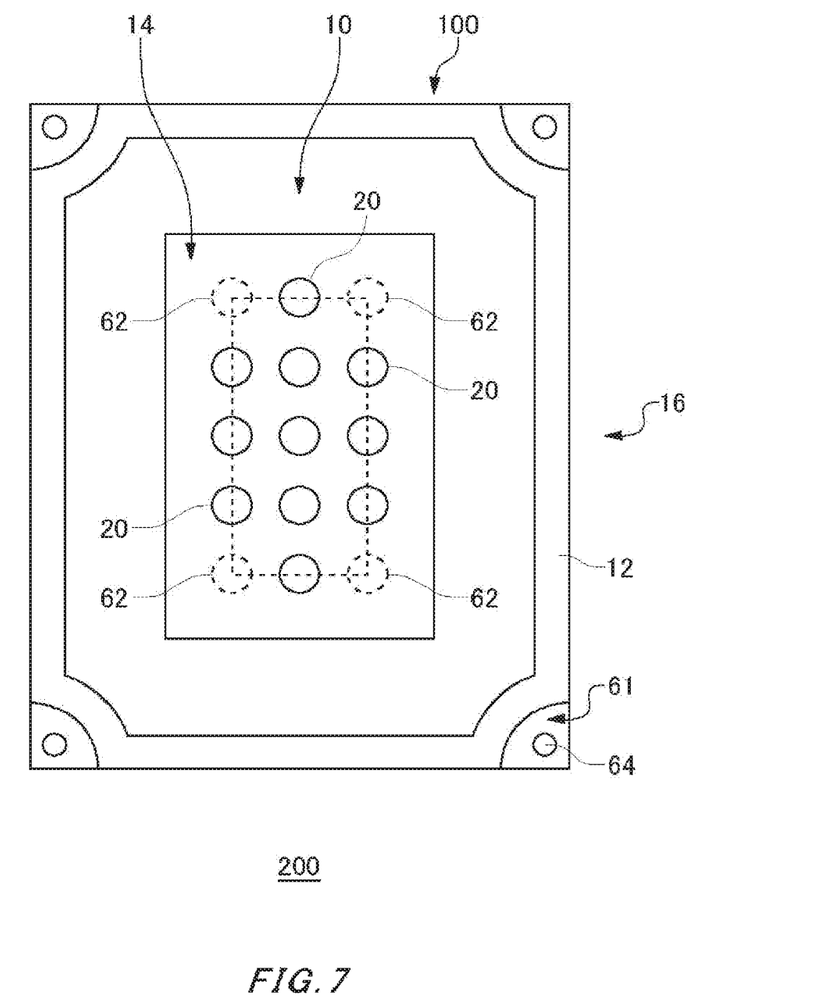
FIG. 7 is a diagram showing a variant of the front surface shape of a case portion 100 and the arrangement of external terminals 20.

FIG. 7 is a diagram showing a variant of the front surface shape of the case portion 100 and the arrangement of the external terminals 20. FIG. 7 shows the upper surface of the case portion 100. In the present example, the opening shape of the hollow portion 14 and the front surface shape of the case portion 100 are similar each other. In the present example, two objects are said to have similar shapes to each other when the shape of one of the objects has corner portions or the like some of which are chipped off.

In the present example, the front surface shape of the case portion 100 and the opening shape of the hollow portion 14 are rectangular. The ratios of the long sides and short sides of the two rectangles are almost equal. It should be noted that respective corner portions of the rectangular of the front surface of the case portion 100 are provided with chipped portions that protrude inward. The chipped portions are provided so that parts on the floor surface side of the case portion 100 remain. That is, the front surface of the case portion 100 is a rectangular whose corner portions are chipped off, and the floor surface of the case portion 100 is a rectangular whose corner portions are not chipped off. Floor portions 61 are exposed at the corner portions of the case portion 100 as seen from the front surface side. The exposed floor portions 61 are provided with through-holes 64 for fixing the semiconductor device 200, for example.

When the corner portions of the case portion 100 are chipped off, it is difficult to form, on the side surface 16 of the corner portions chipped off, the irregularity portion 18 as shown in FIG. 1. For this reason, the creepage distance of the portions on the side surface 16 becomes short.

On the other hand, when the plurality of external terminals 20 are arranged in a matrix conforming to the rectangular shape of the hollow portion 14, the creepage distance of paths that are between the external terminals 20 arranged at corner portions 62 in the matrix and the metallic plate 24 on the rear surface of the case portion 100 and pass through the corner portions of the case portion 100 becomes short.

In the semiconductor device 200 according to the present example, the plurality of external terminals 20 are arranged in a matrix, and the external terminals 20 are not arranged at the corner portions 62 of the rectangular shape of the matrix. Thereby, because the external terminals 20 are not provided at locations where the creepage distance from the metallic plate 24 become relatively short, the breakdown voltage of the semiconductor device 200 can be maintained even if chipped portions are provided to the corner portions of the case portion 100. Note that Variant 4 can be combined with any or a combination of Variants 1 to 3.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor element;
   a case portion that houses the semiconductor element; and
   an external terminal provided to a front surface of the case portion, wherein
   the front surface of the case portion has, formed thereon:
      a wall portion that protrudes from the front surface; and
      a hollow portion that is provided to a region surrounded by the wall portion and is depressed relative to the front surface, and
   the external terminal is arranged on a floor surface of the hollow portion,
   the front surface of the case portion has a rectangular shape whose corner portions are chipped off,
   an opening of the hollow portion has a rectangular shape,
   a plurality of the external terminals are arranged on the floor surface of the hollow portion and in a matrix to conform to a rectangular shape, and
   the external terminal is not arranged at corner portions of the rectangular shape of the matrix.

2. The semiconductor device according to claim 1, wherein an external terminal is not provided to the wall portion.

3. The semiconductor device according to claim 1, wherein an upper end of the external terminal is provided in the hollow portion.

4. The semiconductor device according to claim 1, wherein at least a partial region of the external terminal extends in a direction inclined relative to a normal line of the front surface of the case portion.

5. The semiconductor device according to claim 1, wherein a depth of the hollow portion from the front surface to the floor surface of the hollow portion is larger than a height of the wall portion from the front surface to an upper surface of the wall portion.

6. The semiconductor device according to claim 5, wherein the depth of the hollow portion is at least twice as large as the height of the wall portion.

7. The semiconductor device according to claim 1, wherein
   the case portion has:
      a container portion that houses the semiconductor element and has an opening; and
      a lid portion that covers the opening of the container portion, and
   the front surface of the lid portion has, formed thereon, the wall portion and the hollow portion.

8. The semiconductor device according to claim 1, wherein a side surface of the case portion has, formed thereon, an irregularity portion.

9. The semiconductor device according to claim 1, wherein a depth of the hollow portion is 5 mm or larger.

10. The semiconductor device according to claim 1, wherein the hollow portion has a first region and a second region that have different depths.

11. The semiconductor device according to claim 1, further comprising a sealing portion that is provided inside the hollow portion and seals in at least a part of the external terminal.

12. The semiconductor device according to claim 1, wherein the opening of the hollow portion and the front surface of the case portion have shapes that are similar to each other.

13. A semiconductor device comprising:
   a semiconductor element;
   a case portion that houses the semiconductor element; and
   an external terminal provided to a front surface of the case portion, wherein
   the front surface of the case portion has, formed thereon:
      a wall portion that protrudes from the front surface; and
      a hollow portion that is provided to a region surrounded by the wall portion and is depressed relative to the front surface, and
   the external terminal is arranged on a floor surface of the hollow portion, and
   a floor surface of the hollow portion has, formed thereon:
      a screw hole that fixes the external terminal to the floor surface; and
      a groove portion that surrounds the screw hole.

* * * * *